(12) United States Patent
Trimble

(10) Patent No.: US 12,111,807 B2
(45) Date of Patent: Oct. 8, 2024

(54) OPTIMIZING STORAGE AND RETRIEVAL OF COMPRESSED DATA

(71) Applicant: HITACHI VANTARA LLC, Santa Clara, CA (US)

(72) Inventor: Ronald Ray Trimble, Acton, MA (US)

(73) Assignee: HITACHI VANTARA LLC, Santa Clara, CA (US)

( * ) Notice: Subject to any disclaimer, the term of this patent is extended or adjusted under 35 U.S.C. 154(b) by 264 days.

(21) Appl. No.: 17/428,653

(22) PCT Filed: Apr. 29, 2019

(86) PCT No.: PCT/US2019/029560
§ 371 (c)(1),
(2) Date: Aug. 5, 2021

(87) PCT Pub. No.: WO2020/222727
PCT Pub. Date: Nov. 5, 2020

(65) Prior Publication Data
US 2022/0129430 A1    Apr. 28, 2022

(51) Int. Cl.
*G06F 16/22*    (2019.01)
*H03M 7/30*    (2006.01)

(52) U.S. Cl.
CPC .......... *G06F 16/2228* (2019.01); *H03M 7/30* (2013.01)

(58) Field of Classification Search
CPC .............................. G06F 16/2228; H03M 7/30
See application file for complete search history.

(56) References Cited

U.S. PATENT DOCUMENTS

| 5,832,490 | A  | * | 11/1998 | Riley | ...................... | H03M 7/30 |
| 7,512,862 | B1 | * | 3/2009 | Taylor | ................. | G06F 11/1076 |
| | | | | | | 714/755 |
| 8,156,306 | B1 | * | 4/2012 | Raizen | .................. | G06F 3/0641 |
| | | | | | | 711/202 |
| 8,504,725 | B2 | * | 8/2013 | Achler | ................ | H03M 7/3088 |
| | | | | | | 709/217 |
| 9,330,105 | B1 | * | 5/2016 | Duprey | ............... | G06F 16/1744 |
| 9,503,123 | B1 | * | 11/2016 | Pinho | ....................... | G06N 5/04 |

(Continued)

OTHER PUBLICATIONS

Japanese Office Action received in corresponding Japanese Application No. 2021-560689 dated Jan. 10, 2023.

(Continued)

*Primary Examiner* — Debbie M Le
*Assistant Examiner* — Huen Wong
(74) *Attorney, Agent, or Firm* — MATTINGLY & MALUR, PC

(57) ABSTRACT

In some examples, a computer system may receive a plurality of chunks of data of a data object. The system may compress the plurality of chunks of data to obtain a plurality of compressed chunks, and may determine whether the plurality of compressed chunks together are less than a threshold size. Based on determining that the plurality of compressed chunks together are less than the threshold size, the system may add, to respective entries in a map data structure, respective sizes of the plurality of compressed chunks. In addition, the system may compact the map data structure by combining values in at least two of the respective entries, and may store the plurality of compressed chunks and the compacted map data structure.

20 Claims, 12 Drawing Sheets

(56) References Cited

U.S. PATENT DOCUMENTS

| | | | |
|---|---|---|---|
| 10,942,660 B2* | 3/2021 | Jin | G06F 3/0608 |
| 11,157,631 B1* | 10/2021 | Whelton | H04L 9/0861 |
| 11,861,331 B1* | 1/2024 | Stokely | G06F 8/443 |
| 2003/0191876 A1* | 10/2003 | Fallon | G06F 9/445 |
| | | | 710/68 |
| 2005/0071479 A1* | 3/2005 | Achlioptas | G06Q 30/02 |
| | | | 709/228 |
| 2007/0208893 A1* | 9/2007 | Azzarello | G06F 16/1744 |
| | | | 710/68 |
| 2009/0055422 A1* | 2/2009 | Williams | H03M 7/30 |
| 2009/0112949 A1* | 4/2009 | Ergan | G06F 12/0802 |
| 2009/0307250 A1* | 12/2009 | Koifman | G06F 21/62 |
| 2011/0179341 A1 | 7/2011 | Falls et al. | |
| 2011/0276777 A1* | 11/2011 | Cho | H03M 7/30 |
| | | | 711/202 |
| 2012/0089781 A1 | 4/2012 | Ranade et al. | |
| 2012/0254193 A1* | 10/2012 | Chattopadhyay | G06F 16/245 |
| | | | 707/747 |
| 2013/0275656 A1* | 10/2013 | Talagala | G06F 12/0246 |
| | | | 711/103 |
| 2013/0305003 A1* | 11/2013 | Matsushita | G06F 11/1458 |
| | | | 711/E12.103 |
| 2016/0050297 A1* | 2/2016 | Koifman | H04L 69/04 |
| | | | 707/693 |
| 2018/0364949 A1* | 12/2018 | Aston | G06F 3/067 |
| 2021/0200833 A1* | 7/2021 | Sharma | G06F 16/9035 |
| 2021/0243009 A1* | 8/2021 | Kawahara | H04L 9/3239 |

OTHER PUBLICATIONS

Extended European Search Report received in corresponding European Application No. 19927358.2 dated Oct. 14, 2022.

Deliege, F. et al., "Position List Word Aligned Hybrid: Optimizing Space and Performance for Compressed Bitmaps", Proceedings of the 13th International Conference on Extending Database Technology, Mar. 22-26, 2010, pp. 228-239.

International Search Report of PCT/US2019/029560 dated Jul. 10, 2019.

* cited by examiner

| Chunk Size Always 64K (302) | Compressed Size (Actual) (304) | Compressed Size in Map (2 Byte Entries) (306) | Compressed Size in Map After One Compaction (3 Byte Entries) (308) | Compressed Size in Map After Two Compaction (3 Byte Entries) (310) |
|---|---|---|---|---|
| 65536 | 65537 | 0 | 0 | 0 |
| 65536 | 65537 | 0 | 0 | |
| 65536 | 65536 | 0 | | |
| 65536 | 65534 | 0 | | |
| 65536 | 65537 | 65535 (64K-1) | 66041 | 197111 |
| 65536 | 500 | 506 | | |
| 65536 | 65537 | 65535 (64K-1) | 131070 (SPECIAL) | |
| 65536 | 65537 | 65535 (64K-1) | | |
| 65536 | 1000 | 1002 | 66537 | 133075 |
| 65536 | 65537 | 65535 (64K-1) | | |
| 65536 | 1000 | 1003 | 66538 | |
| 65536 | 65538 | 65535 (64K-1) | | |

Rows labeled: 312, 314, 316, 318, 320, 322, 324, 326

| | BYTE 1 | | | BYTE 2 | |
|---|---|---|---|---|---|
| RESERVED (1 BIT) | SPECIAL VALUE INDICATOR (1 BIT) | STATE OF MAP (2 BIT) | CHUNK SIZE AS A POWER OF 2 MINUS 10 (4 BITS) (1KB – 32MB) | CHUNKS PER OPERATION AS A POWER OF 2 (4 BITS) | OFFSET FREQUENCY AS A POWER OF 2 (4 BITS) |
| 0 | 1 | 3 | 6 (2^(10+6) = 64K) | 2 | 3 |

| | 704 | 702 | | | | | |
|---|---|---|---|---|---|---|---|
| 706 → | Not Compressed | 0 | | | | | ← 750 |
| 708 → | Not Compressed | 0 | | | | | |
| 710 → | Not Compressed | 0 | | | | | |
| 712 → | Not Compressed | 0 | | | | | |
| 714 → | Special Size | 65535 | | | | | |
| 716 → | Size with Overflow | 506 | | | | | ← 752 |
| 718 → | Special Size | 65535 | | | | | |
| 720 → | Special Size | 65535 | | | | | |
| 722 → | Absolute Offset | 459255 | | | | | |
| 724 → | Size with Overflow | 1002 | | | | | |
| 726 → | Special Size | 65535 | | | | | ← 754 |
| 728 → | Special with Overflow | 1003 | | | | | |
| 730 → | Special Size | 65535 | | | | | |
| 732 → | Compressed Size | 50000 | | | | | |
| 734 → | Compressed Size | 50000 | | | | | ← 756 |
| 736 → | Compressed Size | 40000 | | | | | |
| 738 → | Compressed Size | 50000 | | | | | |
| 740 → | Absolute Offset | 782330 | | | | | |
| 742 → | Compressed Size | 50000 | | | | | |
| 744 → | Compressed Size | 50000 | | | | | ← 758 |
| 746 → | Compressed Size | 30000 | | | | | |

| | 704 | 702 | | | |
|---|---|---|---|---|---|
| 802 — | NOT COMPRESSED | 0 | | | ← 750 |
| 804 — | NOT COMPRESSED | 0 | | | |
| 806 — | SIZE WITH OVERFLOW | 66041 | | | ← 752 |
| 808 — | SPECIAL SIZE | 131070 | | | |
| 810 — | COMPRESSED SIZE | 66537 | | | ← 754 |
| 812 — | COMPRESSED SIZE | 66538 | | | |
| 814 — | COMPRESSED SIZE | 100000 | | | ← 756 |
| 816 — | COMPRESSED SIZE | 90000 | | | |
| 818 — | ABSOLUTE OFFSET | 782330 | | | |
| 820 — | COMPRESSED SIZE | 100000 | | | ← 758 |
| 746 — | COMPRESSED SIZE | 30000 | | | |

FIG. 8

OPTIMIZING STORAGE AND RETRIEVAL OF COMPRESSED DATA

TECHNICAL FIELD

This disclosure relates to the technical field of compressed data storage and retrieval.

BACKGROUND

Data stored in storage systems may sometimes be compressed to increase the amount of data that is able to be stored in the storage system. As one example, compressed data objects may be stored over a network at one or more network storage location. If a user desires to access a portion of a stored data object through a ranged read, all object data preceding the requested portion may typically be retrieved from the network storage and decompressed. For instance, conventional techniques may not enable decompression starting at only a specific requested position without determining the compression for the preceding data. Thus, all of the preceding data may typically be decompressed to enable decompression and access to the desired portion. This process can be computationally inefficient and time consuming.

SUMMARY

Some implementations include a computer system that may receive a plurality of chunks of data of a data object. The system may compress the plurality of chunks of data to obtain a plurality of compressed chunks, and may determine whether the plurality of compressed chunks together are less than a threshold size. Based on determining that the plurality of compressed chunks together are less than the threshold size, the system may add, to respective entries in a map data structure, respective sizes of the plurality of compressed chunks. In addition, the system may compact the map data structure by combining values in at least two of the respective entries, and may store the plurality of compressed chunks and the compacted map data structure.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIG. 3 illustrates an example data structure showing distribution of special value overflows and map compaction according to some implementations.

FIG. 5 illustrates an example data structure and layout of a map header according to some implementations.

FIG. 7 illustrates an example data structure configuration of a map according to some implementations.

FIG. 8 illustrates the example data structure configuration of a map after one compaction according to some implementations.

DESCRIPTION OF THE EMBODIMENTS

Figure 1:
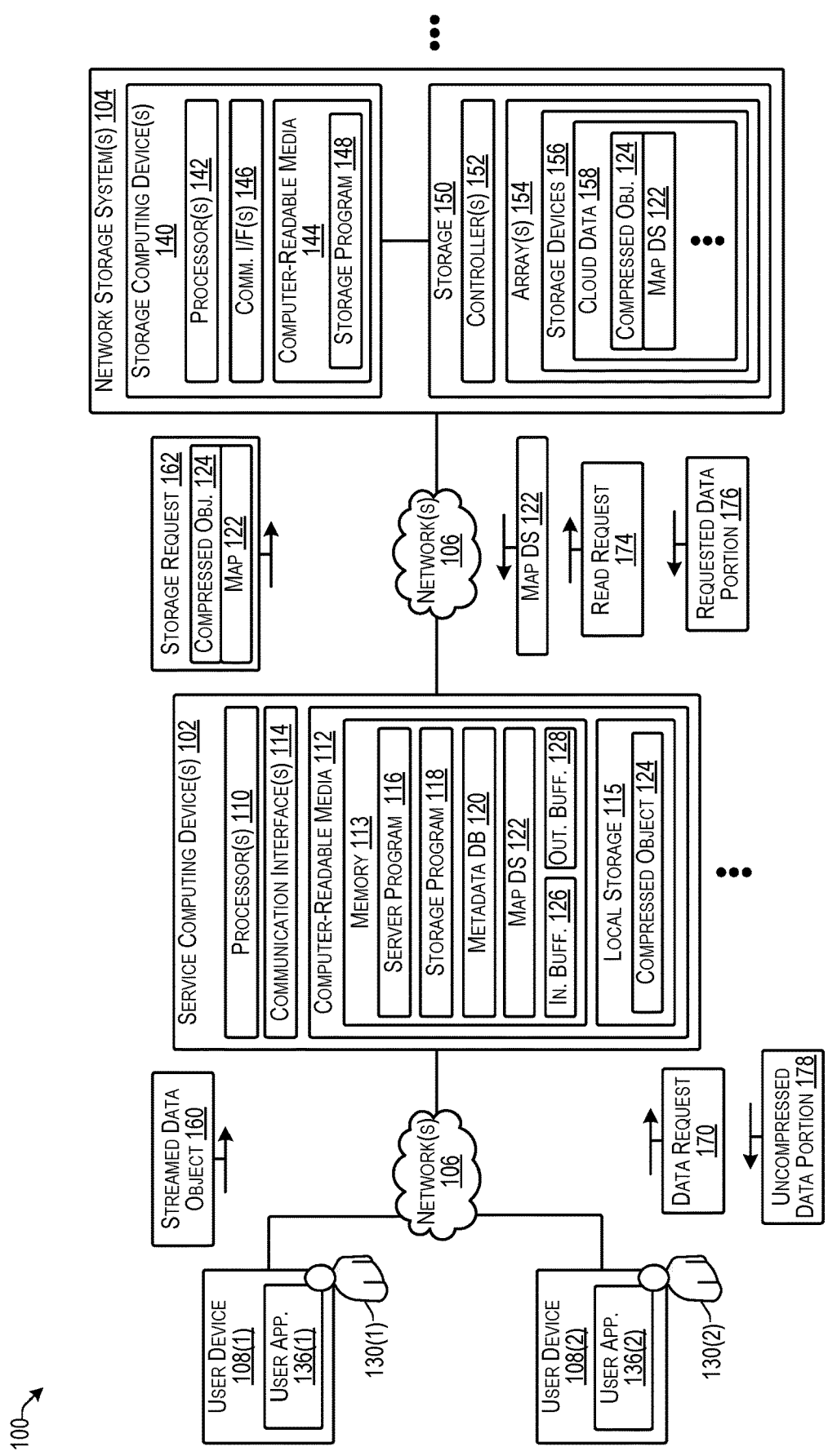
FIG. 1 illustrates an example architecture of a system able to store and access compressed data according to some implementations.

Some implementations herein are directed to techniques and arrangements for enabling high performance ranged reads of compressed data and/or compressed data mixed with uncompressed data. In some cases, the data may be stored at a storage location in the cloud or otherwise stored over a network at a network storage location. In some examples, a map data structure (referred to herein after as a "map"), may be generated and maintained to associate compressed and uncompressed positions in the data. For instance, while the data is being compressed, the map may be created for correlating positions in the original uncompressed object with offsets in the compressed data. Furthermore, when a range of the object data of the compressed object is requested to be accessed, such as based on a user request, or the like, the map may be used to enable decompression to be initiated at an offset just prior to the requested range, rather than having to decompress the entire compressed object.

In some examples, the data may be divided and compressed in chunks (such as with a designated default size, e.g., 32K, 64K, 128K, 256K, and so forth). For example, a chunk may have a designated chunk size, which may correspond to a number of bytes in the original object used for each compression request. The last chunk in an object may have a smaller chunk size than the other chunks in the object. An entry may be added to the map for each chunk representing the size of the chunk after the chunk is compressed. Furthermore, a map header may be generated to describe the map including information such as the chunk size. The map header may be accessed before the map and in some cases the map header may be used to locate the map. The map itself may be appended to or may otherwise follow the map header or, alternatively, the map may be appended to the compressed object.

In some cases, the map may be compacted to a smaller size, such as for enabling the map to better fit entirely in memory. To compact the map, compacted regions cannot not include a mix of compressed and uncompressed data. To achieve this, the streaming object data may be compressed as chunks (e.g., 64K) with a larger streamed collection size (e.g., 512K). If an entire collection of chunks (referred to herein as an "operation" in some examples) as a region is incompressible, all chunk sizes in the collection may be recorded as having a compressed size of "0" in the map and compression is not used for any of the corresponding chunks. Compacting collections of uncompressed chunks in the map is done by adding all the 0 sized chunks which results in a 0 sized compacted chunk which is still not compressed.

Implementations herein provide for optimized ranged read performance of compressed files and other data objects. The examples may include a relational compression map associating compressed and uncompressed positions and techniques for minimizing map size—for example limiting the map size to 2 bytes per 64K of compressed data. Further, the examples herein provide the ability to compress streaming files and other streaming data where the initial size and compressibility of the data are unknown, and to use compression only on regions where compression is beneficial.

Further, through the map compacting techniques herein, the entire map may be maintained in memory during compression, which may not be possible in conventional mapping techniques because the map may grow too large. Additionally, some examples allow for an initial optimal chunk size like 64K with the ability to compact the map as the map grows larger so that the map may be maintained in memory. Additionally, compressible and incompressible regions may be combined during compaction without using extra bytes in the map. In some examples, the impossible size of zero or other suitable indicator may be used to indicate compression was not used on a region of data.

In addition, the examples herein overcome the challenge presented when the collection of chunks is compressible, but one or more individual chunks are not compressible. For instance, when using chunk sizes like 64K or 16M, the optimized size field of 2 or 3 bytes, respectively, exactly fits the potential size without any room to include an increase in size. After designating each collection (operation) to save at least 2 bytes per 64K to use compression, a special compressed size of 64K−1 (or a multiple thereof for larger chunks) may be used in the map to denote compression was used without benefit. The extra bytes may be added to neighbor chunks in the collection using an algorithm that allows compaction to simply add neighbor chunks. If a collection has a special size, individual chunk positions in the compressed object cannot be determined and decompression may start on the collection boundary where the position can be determined.

Additionally, some examples include optimization to allow incompressible chunks to avoid compression. For example, each chunk may be represented with a compressed size of 0 to indicate that compression was not used. If compression of the chunk would be insufficient to make it worthwhile to use compression, the uncompressed data instead of compressed data may be included in the compressed object and a 0 may be associated with the uncompressed data in the map to indicate compression was not used.

Furthermore, some examples include map compaction to minimize the map size. For instance, each entry in the map may be a chunk size representation associated with a compressed chunk size. This means each entry in the map may only need to be big enough to contain the chunk size of the corresponding chunk, assuming that compression saves some space. Therefore, a chunk size of 64K or less may only utilize two bytes in the map for every chunk. For chunk sizes larger than 64K, but less than 16 MB, three bytes may be utilized in the map for every chunk. Furthermore, in the case of chunks having a chunk size larger than 16 MB four bytes may be utilized in the map for each chunk of data.

In addition, some examples include optimization to allow streaming of data with periodic map compacting. Initially, in the case of compressing a streaming object, the complete size of the streaming object may often be unknown. The streaming data may be compressed and stored in the network storage location (also referred to as cloud storage in some examples). To efficiently handle map creation, the map may be maintained in memory until the map is written to the cloud along with the compressed object, and in some cases, may be periodically compacted to keep the map size below a specified threshold size. By maintaining the entire map in memory, the map does not have to be written to a local storage, such as a hard disk drive or solid state drive, during creation of the map and then read again after compression is complete for sending the finished map to network storage location for storage in association with the compressed data. In some examples, following completion of compression of the object, the map may be appended to the compressed object so the map may be included in the compressed size of the data object (see, e.g., FIG. 2).

As one non-limiting example, the map for a 2 TB object may utilize almost 62 MB when using a chunk size of 64 KB per chunk. In order to handle compression of such large objects while maintaining the map in memory, the map herein may be compactible. Compacting the map may be accomplished by combining adjacent entries and doubling the chunk size. For example, suppose that the 62 MB map for the 2 TB object is compacted until the chunk size represented by the map entries is 1 MB rather than 64 KB per chunk. In this case, the map may utilize less than 6 MB, rather than 62 MB.

In the examples herein, it is not desirable for the compacting to result in a mix of compressed and uncompressed chunks. Therefore, the chunk size at max compaction may be used as an operation size. For instance, an operation may include a collection of chunks that either all use compression or all skip compression. Thus, the system may determine if compression should be used after results are gathered from all of the chunks included in the operation. For example, each operation may be a collection of a power of 2 chunks. All chunks in an operation are compressed before determining if the operation should be compressed or not. If the operation is incompressible (e.g., compression results in an overall reduction in size that is less than a threshold amount), the map is updated with a 0 for every chunk in the operation to indicate compression was not used. If compression is used for any chunk in the operation, the compression is used for all the chunks in that operation.

For discussion purposes, some example implementations are described in the environment of one or more service computing device(s) in communication with one or more network storage locations and one or more user devices that enables optimizing compression of data. However, implementations herein are not limited to the particular examples provided, and may be extended to other types of computing system architectures, other types of storage environments, other types of client configurations, other types of data, and so forth, as will be apparent to those of skill in the art in light of the disclosure herein.

FIG. 1 illustrates an example architecture of a system 100 able to store and access compressed data according to some implementations. The system 100 includes a one or more service computing device(s) 102 that are able to communicate with, or otherwise coupled to, at least one storage system(s) 104, such as through one or more networks 106. Further, the service computing device(s) 102 is able to communicate over the network(s) 106 with one or more user computing devices 108, such as user devices 108(1), 108(2), . . . , which may be any of various types of computing devices, as discussed additionally below.

In some examples, the service computing device(s) 102 may include one or more servers that may be embodied in any number of ways. For instance, the programs, other functional components, and at least a portion of data storage of the service computing device(s) 102 may be implemented on at least one server, such as in a cluster of servers, a server farm, a data center, a cloud-hosted computing service, and so forth, although other computer architectures may additionally or alternatively be used. In the illustrated example, the service computing device(s) 102 include, or may have associated therewith, one or more processors 110, one or more computer-readable media 112, and one or more communication interfaces 114.

Each processor 110 may be a single processing unit or a number of processing units, and may include single or multiple computing units, or multiple processing cores. The processor(s) 110 can be implemented as one or more central processing units, microprocessors, microcomputers, microcontrollers, digital signal processors, state machines, logic circuitries, and/or any devices that manipulate signals based on operational instructions. As one example, the processor(s) 110 may include one or more hardware processors and/or logic circuits of any suitable type specifically programmed or configured to execute the algorithms and processes described herein. The processor(s) 110 may be configured to fetch and execute computer-readable instructions stored in the computer-readable media 112, which may program the processor(s) 110 to perform the functions described herein.

The computer-readable media 112 may include memory 113 and local storage 115. For example, the memory 113 may include volatile and nonvolatile memory and/or removable and non-removable media implemented in any type of technology for storage of information, such as computer-readable instructions, data structures, program modules, or other data. For example, the memory 113 may include, but is not limited to, RAM, ROM, EEPROM, flash memory or other memory technology. Further, the local storage 115 and other computer-readable media 112 may include optical storage, solid state storage, magnetic tape, magnetic disk storage, RAID storage systems, storage arrays, network attached storage, storage area networks, cloud storage, or any other medium that can be used to store the desired information and that can be accessed by a computing device. Depending on the configuration of the service computing device 102, the computer-readable media 112 may include a tangible non-transitory medium to the extent that, when mentioned, non-transitory computer-readable media exclude media such as energy, carrier signals, electromagnetic waves, and/or signals per se. In some cases, the computer-readable media 112 may be at the same location as the service computing device 102, while in other examples, a portion of the computer-readable media 112 may be partially remote from the service computing device 102. For instance, in some cases, the computer-readable media 112 may include a portion of storage in the storage system(s) 104.

The computer-readable media 112 may be used to store any number of functional components that are executable by the processor(s) 110. In many implementations, these functional components comprise instructions or programs that are executable by the processor(s) 110 and that, when executed, specifically program the processor(s) 110 to perform the actions attributed herein to the service computing device 102. Functional components stored in the computer-readable media 112 may include a server program 116 and a storage program 118, each of which may include one or more computer programs, applications, executable code, or portions thereof. For example, the server program 116 may provide communication functionality with the user devices 108 and the storage system(s) 104.

The storage program 118 may be configured to perform the data compression/decompression and map generation and management functions described herein. In addition, the storage program 118 may include a database management function for creating and managing a metadata database (DB) 120 containing metadata related to data stored and managed by the service computing device(s) 102. For example, the storage program 118 may include executable instructions configured to cause the storage program 118 to maintain file systems, object information, data management information, and other information as part of the metadata database 120. The storage program 118 may further perform a management function for managing other types of information included in the metadata database 120, such as user information. The storage program 118 may further manage storage of data stored at the network storage system(s) 104, such as for managing retention periods, storage protection levels, replication of stored data to other sites for disaster recovery and so forth.

In addition, the computer-readable media 112 may store data, data structures, and other information used for performing the functions and services described herein. For example, during compression of an object, the computer-readable media 112 may store a map 122 of the compressed object 124 in memory 113, while the compressed object may be stored in local storage 115 if the compressed object is too large to store in memory 113. In addition, the computer-readable media 112 may store the metadata DB 120 that is used by the storage program 118 when performing some of the functions described herein, as discussed additionally below. Additionally, the memory 113 may include an ingest buffer 126 and an output buffer 128 that may be used to temporarily store at least portion of data, such as during compression and/or decompression of the data.

The service computing device 102 may also include or maintain other functional components and data, which may include programs, drivers, etc., and the data used or generated by the functional components. Further, the service computing device 102 may include many other logical, programmatic, and physical components, of which those described above are merely examples that are related to the discussion herein.

The one or more communication interfaces 114 may include one or more software and hardware components for enabling communication with various other devices, such as over the one or more network(s) 106. Thus, the communication interfaces 114 may include, or may couple to, one or more ports that provide connection to the network(s) 106 for communicating with the storage system(s) 104, the other service computing device(s) 102, and the user devices 108. For example, the communication interface(s) 114 may enable communication through one or more of a LAN, the Internet, cable networks, cellular networks, wireless networks (e.g., Wi-Fi) and wired networks (e.g., Fibre Channel, fiber optic, Ethernet), direct connections, as well as close-range communications such as BLUETOOTH®, and the like, as additionally enumerated elsewhere herein.

The one or more networks 106 may include any suitable network, including a wide area network, such as the Internet; a local area network (LAN), such as an intranet; a wireless network, such as a cellular network, a local wireless network, such as Wi-Fi, and/or short-range wireless communications, such as BLUETOOTH®; a wired network including Fibre Channel, fiber optics, Ethernet, or any other such network, a direct wired connection, or any combination thereof. Accordingly, the one or more networks 106 may include both wired and/or wireless communication technologies. Components used for such communications can depend at least in part upon the type of network, the environment selected, or both. Protocols for communicating over such networks are well known and will not be discussed herein in detail. Accordingly, the service computing device(s) 102, the network storage system(s) 104 and the user devices 108 are able to communicate over the one or more networks 106 using wired or wireless connections, and combinations thereof.

Each user device 108 may be any suitable type of computing device such as a desktop, laptop, tablet computing device, mobile device, smart phone, wearable device, and/or any other type of computing device able to send data over a network. Users 130(1), 130(2), . . . , may be associated with user devices 108(1), 108(2), . . . , respectively, such as through a respective user account, user login credentials, or the like. Furthermore, the user devices 108 may be able to communicate with the service computing device(s) 102 through the one or more networks 106, through separate networks, or through any other suitable type of communication connection. Numerous other variations will be apparent to those of skill in the art having the benefit of the disclosure herein.

Further, each user device 108(1), 108(2), . . . , may include a respective instance of a user application 136(1), 136(2), . . . , that may execute on the respective user device 108(1), 108(2), . . . , such as for communicating with the server program 116, e.g., for sending user data for storage on the network storage system(s) 104 and/or for receiving stored data from the network storage system(s) 104. In some cases, the application 136 may include a browser or may operate through a browser, and the server program 116 may include a web application for enabling the user to access stored data through the service computing device(s) 102. Alternatively, in other cases, the application 136 may include any other type of application having communication functionality enabling communication with the server program 116 over the one or more networks 106.

The storage system(s) 104 may include one or more storage computing devices 140, which may include one or more servers or any other suitable computing device, such as any of the examples discussed above with respect to the service computing device 102. The storage computing device(s) 140 may each include one or more processors 142, one or more computer-readable media 144, and one or more communication interfaces 146. For example, the processors 142 may correspond to any of the examples discussed above with respect to the processors 110, the computer-readable media 144 may correspond to any of the examples discussed above with respect to the computer-readable media 112, and the communication interfaces 146 may correspond to any of the examples discussed above with respect to the communication interfaces 114.

In addition, the computer-readable media 144 may include a storage program 148 as a functional component executed by the one or more processors 142 for managing the storage of data on a storage 150 included in the storage system(s) 104. The storage 150 may include one or more controllers 152 associated with the storage 150 for storing data on one or more arrays 154 of storage devices 156, or the like. For instance, the controller 152 may control the arrays 154, such as for configuring the arrays 154 in a RAID configuration, JBOD configuration, or the like, and/or for presenting logical units based on the storage devices 156 to the storage program 148, and for managing data, such as data objects or other data, stored on the underlying physical storage devices 156 as cloud data 158. The storage devices 156 may be any type of storage device, such as hard disk drives, solid state drives, optical drives, magnetic tape, combinations thereof, and so forth. In some examples, the network storage system(s) 104 may include commercially available cloud storage as is known in the art, while in other examples, the network storage system(s) 104 may include private or enterprise storage systems accessible only by an entity associated with the service computing device(s) 102.

In the system 100, the users 130 may store data to, and receive data from, the service computing device(s) 102 that their respective user devices 108 are in communication with. Accordingly, the service computing device(s) 102 may provide local storage for the users 130 and respective user devices 108. During steady state operation there may be users 108 periodically communicating with the service computing device(s) 102.

In some cases, the service computing device(s) 102 may be arranged into one or more groups, clusters, systems or the like. For instance, in some examples (not shown in FIG. 1) the service computing device(s) 102 may be arranged in pairs in which a first service computing device 102 may be coupled to a second service computing device 102 so that together they form a computing node for providing storage and data management services to a plurality of the user devices 108. For instance, the first service computing device 102 may act as a primary computing device, while the second service computing device 102 may act as a secondary computing device, at least with respect to maintaining the metadata database 120. Additionally, or alternatively, in some examples, the service computing device(s) 102 may be arranged in a plurality of clusters at geographically separate and remote locations to enable replication and disaster recovery. Numerous other configurations will be apparent to those of skill in the art having the benefit of the disclosure herein.

In the example of FIG. 1, suppose that a first user 130(1) streams a data object as indicated at 160 to the service computing device 102 for storage at the network storage system 104. The storage program 118 may be executed on the service computing device 102 to compress the streamed data object 160. While the object is being streamed to the service computing device 102, the map 122 may be created and maintained in the memory 113 without needing to store the map 122 on disk in the local storage 115. As one example, the storage program 118 may initially use a default chunk size, such as 64K chunks in 512K operations when generating the map 122. This provides better performance during data retrieval than, for example, a single setting map for 256K chunks which might typically be expected to always fit in memory. Thus, the default arrangement may reduce the map memory needed for large objects in half while offering four times the range performance with only double the memory or map size requirement for most objects. Additional examples of map sizes relative to various object sizes and chunk sizes are discussed below, e.g., with respect to FIG. 2. Furthermore, these parameters may be optimized by a user based on user's requirements.

When the object has completed streaming to, and being compressed by, the service computing device 102, in some examples, the map 122 may be appended to the compressed object 124 and the compressed object 124 and the map 122 may be sent over the network(s) 106 to the network storage system 104. The network storage 104 may store the compressed object 124 and map 122 in the storage 150. In addition, a map header (not shown in FIG. 1) may be created for the map 122 and may be stored in the metadata database 120 in association with other metadata for the object 124.

Further, while the map 122 may be appended to the compressed object 124 in this example, in other examples, the map 122 may be stored at the network storage 104 separately from the associated compressed object 124. In other cases, the map 122 may be appended to the map header and stored in the metadata database 120.

Furthermore, in some cases, one or more portions of the compressed object 124 may be sent to the network storage system 104 separately from one or more other portions of the compressed object 124 and/or the map 122. For example, as portions of the streamed data object 160 are compressed, the compressed portions may be sent independently to the network storage system 104, such as in the case of a very large object, or in the case that it is desirable to send the compressed object directly from memory 113, rather than storing the compressed object to local storage 115, and subsequently reading the compressed object from the local storage 115. Numerous other variations will be apparent to those of skill in the art having the benefit of the disclosure herein.

Furthermore, as one example, suppose that user 130(2) subsequently sends a data request 170 that requests that a portion of compressed object 124 be sent to the user device 108(2). The storage program 118 may access the map header, determine that the map is stored at the network storage system 104, and may obtain the map 122. Based on determining a position in the uncompressed object from which to begin reading data to obtain the requested data portion, and based on the offsets in the map 122 and other information as discussed additionally below, the storage program 118 may send a read request 174 for a portion of the data object to the network storage system 104. In response, the network storage system 104 may send the requested data portion to the service computing device 102. The storage program 118 may decompress one or more parts of the requested data portion and may reply to the data request 170 with the uncompressed data portion 178.

Figure 2:
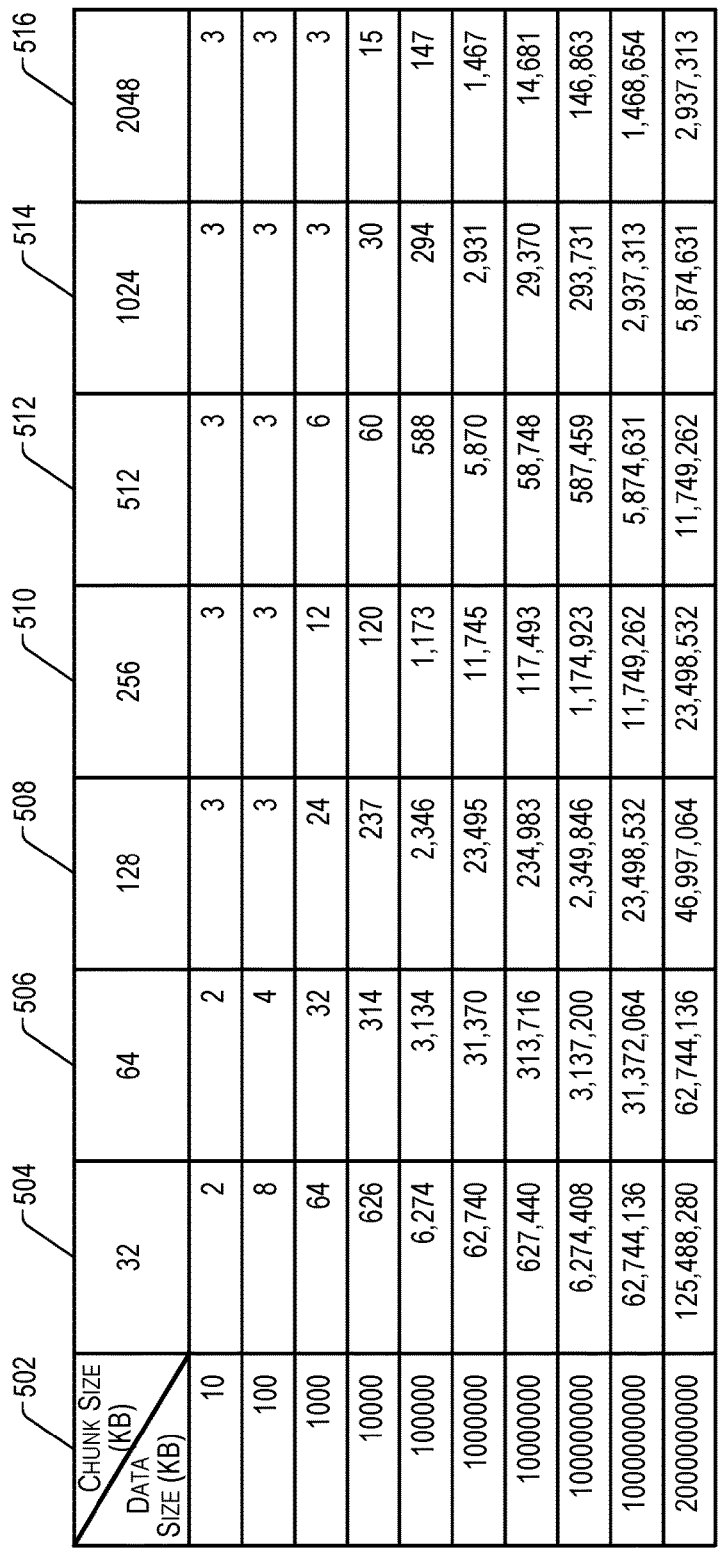
FIG. 2 illustrates an example data structure including map sizes per chunk size and data size according to some implementations.

FIG. 2 illustrates an example data structure 200 including map sizes per chunk size and data size according to some implementations. The data structure 200 in this example shows map sizes per chunk size and data size (e.g., object size), and is serialized with a 1024 entry offset frequency. For instance, offset frequency may indicate the number of map entries (compressed sizes) that occur between absolute offsets in the map. The absolute offset may include the offset into a compressed object where the chunk exists to which the associated map entry applies. Additionally, a compressed size entry may include the compressed size of a single chunk as represented in the map. In some cases, the compressed size entry might be 0 to indicate compression was not used or a special value to indicate all compressed size entries for the operation are unknown.

In the illustrated example, the data structure 200 includes data size column 502 that lists ranges of data sizes from 10 KB to 2,000,000,000 KB. The data structure further includes seven map size columns 504, 506, 508, 512, 514 and 516 that list map sizes for chunk sizes 32 KB, 64 KB, 128 KB, 256 KB, 512 KB, 1024 KB, and 2048 KB, respectively, and the corresponding data sizes listed in column 502. For example, when the data size is 100,000 KB, and the chunk size is 64 KB, the map size is 3134 bytes.

In some examples herein, an entire operation (e.g., a group of sequential chunks) may be compressed or not compressed. The compressibility of an operation can be determined by a total space savings for all chunks in the operation. For example, if the compression does not achieve at least a threshold then the entire operation might be left uncompressed.

On the other hand, even though one or more individual chunks in the operation might not be compressible or might be minimally compressible, the entire operation may still be compressed if the other chunks in the operation are sufficiently compressible to achieve the threshold level of compression for the entire operation. In this situation, there may be an issue that the optimal map entry size does not fit an uncompressed chunk. For example, 64K-1 is the largest number that is able to fit in two bytes, which is the optimal entry size used for 64 KB sized chunks in the map. To handle this, a special size of 64K-1 may be used to indicate the actual compressed size is at least 64K-1.

Additional bytes may be distributed to other compressed size entries in the operation using a distribution algorithm discussed additionally below that guarantees compaction will combine the entries correctly. When this happens to at least one chunk in an operation, size entries of other chunks in the operation may be incorrect. However, the total compressed operation size is still the sum of compressed chunk size entries in the operation. In this case, decompression may only be aligned on the first chunk in an operation when any map entry for the operation is a special size. When that is the case, entire chunks of decompressed data may need to be discarded before reaching a desired range start.

Because the special size is maintained through compactions of the map, the value may double for every compaction. A special size is only required when the entry size is optimal such as two bytes for 64K chunks and three bytes for 16 MB chunks, but in this situation the special size is maintained through compactions. As another example, the special size ends up being 16 MB-256 for 16 MB chunks when the special size is used for maps with a 16 MB chunk size. As one non-limiting example, the threshold average minimum required space savings for operations to be considered compressible may be 2 bytes per 64K regardless of chunk or operation size. A higher compressibility may be configured, but not a lower compressibility. Furthermore, the operation size may be known during reads, so the operation size value may be included in the map header, as discussed additionally below.

FIG. 3 illustrates an example data structure 300 showing distribution of special value overflows and map compaction according to some implementations. The data structure 300 includes a chunk size 302, a compressed size (actual size) 304, a compressed size in map (with 2 Byte entries) 306, a compressed sized in map after one compaction (3 Byte entries) 308, and a compressed size in map after two compactions (3 Byte entries). In FIG. 3, as indicated a 302, the chunk size is 64K. Further, the compressed actual sizes are indicated at 304, which shows that the first four entries are not compressed (as indicated the "0" for the compressed size in map at column 306).

In this example, suppose that the first four entries are a first operation that was not compressed; a second operation starts at row 312, and includes a plurality of special values; and a third operation starts at 320, and also include a plurality of special values. In particular, at rows 312, 316, 318, 322, and 326, the compressed actual size indicated in column 304 exceeds 64K. Accordingly, the extra bytes are subtracted and redistributed so that each of the values in column 306 for rows 312, 316, 318, 322, and 326 is equal to 64K-1, i.e., 65535. For example, 6 extra bytes (2 each from 312, 316 and 318) are added to the value in row 314, increasing the value 500 at column 304 to 506 at column

306. Similarly, two bytes (from 322) are added to the value 1000 in row 320, and 3 bytes (from 326) are added to the value in row 324. Accordingly, the additional bytes are distributed among the other compressed chunk values to create the special values in column 306.

As mentioned above, a particular chunk might be incompressible in the midst of a compressible operation. Compressed size entries in the map may utilize a minimum number of bytes to optimize compression by minimizing the map size. If the number of bytes used for an entry barely fits the chunk size such as the case for 64K chunks, the compressed size will not fit in the entry unless the chunk is compressible. Two bytes (the map entry size for 64K chunks) are able to be used to express numbers from 0 to 65535 (64K−1). 64K or greater cannot be represented by 2 bytes. Therefore, in implementations herein, to use compression for such an operation, a special size may be used in the map entry to signify the actual compressed size is not known.

When the operation overall (i.e., the group of chunks) is compressible, but one or more of the chunks is not, the overflow from the special size for the uncompressible chunk(s) may be distributed among other map entries for the operation. This keeps the compressed operation size correct and allows navigation at the operation level. For instance, it would be sufficient to distribute the extra bytes to any other chunk with a smaller compressed size if the map could not be compacted. However, because the map can be compacted later, the overflow may be distributed in the exact reverse of how the overflow would be combined later during compaction. During compaction of an operation with a special size, actual compressed sizes of chunks in the operation cannot be determined. This means compaction may be as simple as combining adjacent pairs. When neither of the adjacent combined entries is special size, the result will not be special size and the combined entry may represent the compressed size of the corresponding combined chunks. The original distribution while all the compressed sizes are still known may account for how the map entries may be combined. By using a special size of $(64K-1)*2^n$, where n is the number of compactions beyond a chunk size of 64K, a compacted chunk size from combining chunk sizes of 64K that is adjacent to a special size can be combined with the special size to produce a special size in the correct entry for a compacted map.

As indicated at column 308, during a first compaction, the first four entries may be combined to have two resulting entries with a value of "0". Furthermore, when the values in 306 at rows 312 and 314 are combined, the result in column 308 is 66041, which is 65535+506 (with 4 bytes still being from rows 316 and 318 which are still incompressible as a pair). Additionally, at rows 316 and 318, two special sizes are combined to result in a new special size 131070. Rows 320 and 322 are combined in a manner similar to 312 and 314, and likewise for rows 324 and 326. During a second compaction, as indicated in column 310, the values in column 308 may be similarly combined by combining adjacent pairs to further compact the map for arriving at the values in column 310.

To guarantee the overflow from a special size is distributed so that all future compactions maintain compressed size integrity, a distribution algorithm, such as described below, may be used to distribute the overflow. The distribution algorithm may work with an array of actual compressed sizes for an operation, the position of the oversized entry, the special size value such as 64K−1, operation power (chunks per operation as a power of 2), and the chunk count, which cannot be greater than chunks per operation on the final operation. Candidates for overflow may be determined by investigating powers of 2 chunks starting with 1 and going to the operation power. The starting entry in the array to investigate may be determined by representing the oversized entry position as a binary value and zeroing out the current power of 2 lower order bits. In order, this puts the investigation start at the beginning of 2 ^ current power entries that may be combined by future potential compaction number (power). Those entries are adjusted to include overflow without going over the special size until the overflow is completely distributed.

In the example of FIG. 3, the second operation (rows 312-318) and the third operation (rows 320-326) show example results of using the distribution algorithm herein for distribution into the two-byte compressed size entries. An example of pseudocode for the distribution algorithm includes the following:

```
discrepancy = operationMap[pos] - special;
for (int power = 1; power <= operationPower; ++power) {
  int start = (pos >> power) << power;
  for (int i = start; i < start + (1 << power) && i < chunkCount; ++i) {
    if (operationMap[i] < special) {
      int extraSpace = min(discrepancy, special - operationMap[i]);
      operationMap[i] += extraSpace;
      discrepancy -= extraSpace;
      if (discrepancy == 0) {
        return;
} } } }
```

Figure 4:
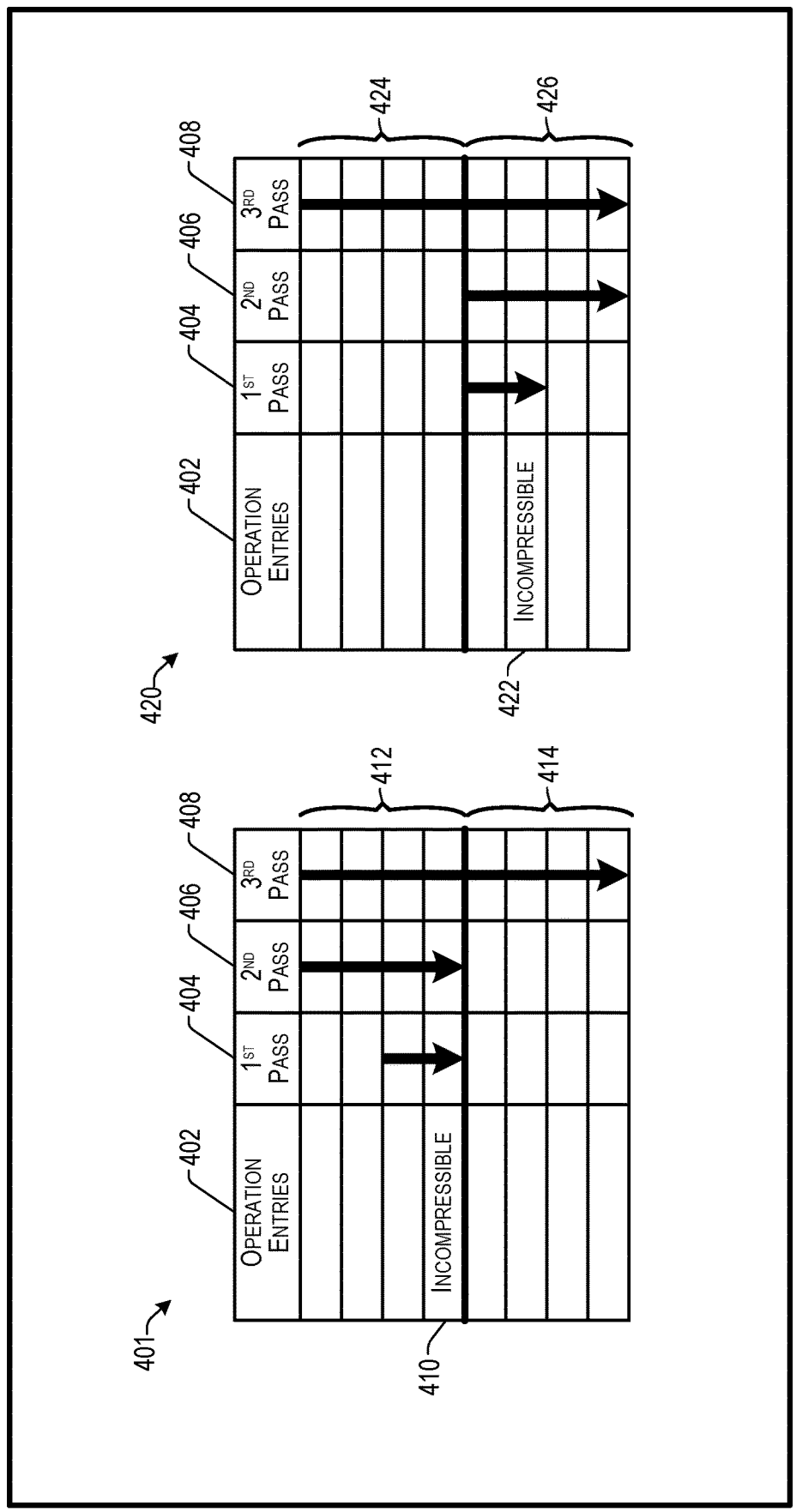
FIG. 4 illustrates examples of operation of the distribution algorithm according to some implementations.

FIG. 4 illustrates examples of operation of the distribution algorithm according to some implementations. In the foregoing distribution algorithm, the distribution algorithm may be executed to make one or more passes for distributing overflow from a special size to other chunk representations (operation entries). For instance, a first example 401 includes operation entries 402, first pass 404, second pass 406, and third pass 408. For example, as indicated at 410, the operation entries 402 include an incompressible entry. The distribution algorithm may be executed to make a first pass 404 to check an immediately adjacent entry in the same operation 412. Next, if the first pass does not result in distribution of the overflow, the distribution algorithm may be executed to make a second pass 406 to check other entries in the same operation 412. Next, if the second pass does not result in distribution of the overflow, the distribution algorithm may be executed to check other entries in an adjacent operation 414. The distribution algorithm may continue until the overflow is distributed.

Similarly, in example 420, as indicated at 422, the operation entries 402 include an incompressible entry. The distribution algorithm make a first pass 404 to check an immediately adjacent entry in the same operation 422. Next, if the first pass does not result in distribution of the overflow, the distribution algorithm may be executed to make a second pass 406 to check other entries in the same operation 422. Next, if the second pass does not result in distribution of the overflow, the distribution algorithm may check other entries in an adjacent operation 424. The distribution algorithm may continue until the overflow is distributed.

FIG. 5 illustrates an example data structure and layout of a map header 500 according to some implementations. The details for the map may fit into two bytes, i.e., a first byte 502 and a second byte 504. For instance, in addition to chunk size, operations size (represented as chunks per operation) and offset frequency, additional details recorded during ingest may be included in the map header to improve read performance. Accordingly, the first byte 502 may include a reserved bit 506, a special value indicator 508 (1 bit), a state of map 510 (2 bits), and a chunk size as a power of 2 minus 10 512 (4 bits). The second byte 504 may include chunks per operation as power of 2 514 (2 bits), and offset frequency as a power of 2 516 (4 bits).

The special value indicator 508 may indicate whether any special value is used in the map. If not, an entry like 64K−1 means actual compressed size and decompression can start on the calculated chunk rather than at the operation start. As one example, "0" may indicate no special values and 64K−1 can be treated as a real size, while "1" may indicate at least one special value was used (or vice versa)

The state of the map 510 may indicate whether there is actually a map, if the map follows the header or the compressed object and if the map includes any uncompressed chunks. There may be no map header if none of the chunks are compressed because the object is not compressed and, therefore, a map is not needed. Additionally, no map can be specified if all chunks are compressed and range requests are not expected for this size object. Alternatively, if the map is specified as inline and the map follows the header, an additional cloud read to get the map may be eliminated. Additionally, if all chunks in the map are compressed, reads from position 0 do not need the map. As an example, "0" may indicate no map; "F" may indicate the map is inline (map contents follow header—not the compressed object); "2" may indicate that the map is external and all chunks are compressed; and "3" may indicate that the map is external and some chunks are not compressed.

The chunk size represented as a ((power of 2)−10) (4 bits) (1 KB—32 MB chunk size) 512 may indicate the chunk size of the chunks represented by the map. In this example, the value in the header is "6", which is equal to 16-10. Consequently, when 16 is the power of 2, the chunk size is 64K.

The chunks per operation represented as a power of 2 514 may be a default value or may be specified by a user. Furthermore, the offset frequency per chunk represented as a power of 2 (4 bits) 516 may also be a default value indicating the number of map entries (compressed sizes) that occur between absolute offsets in the map.

Based on example settings extended from the data structure 300 discussed above, the chunk Size=64K, the operation size=256K (4 chunks), and the absolute offset frequency=8. Further, the map includes a special value and some chunks are not compressed.

In addition, the header 500 may include optimization to enable partial map reads to satisfy range requests. For instance, since the map for large objects can be several megabytes in size, reading the entire map for small ranges might be too expensive. To address this issue, an absolute offset into the compressed object may be placed in the map based on a predetermined offset frequency. This frequency is based on the final number of chunks, and may not be affected by the chunk size or whether the map was compacted. The offset frequency creates independent fixed size segments in the map that can be accessed to determine range locations in the compressed object. A map segment may include an 8 byte absolute offset into the compressed object for the first chunk followed by a compressed size entry for the subsequent (offset frequency) chunks. Accordingly, the offset frequency 516 may be included in the map header 500 so the map can be parsed.

Figure 6:
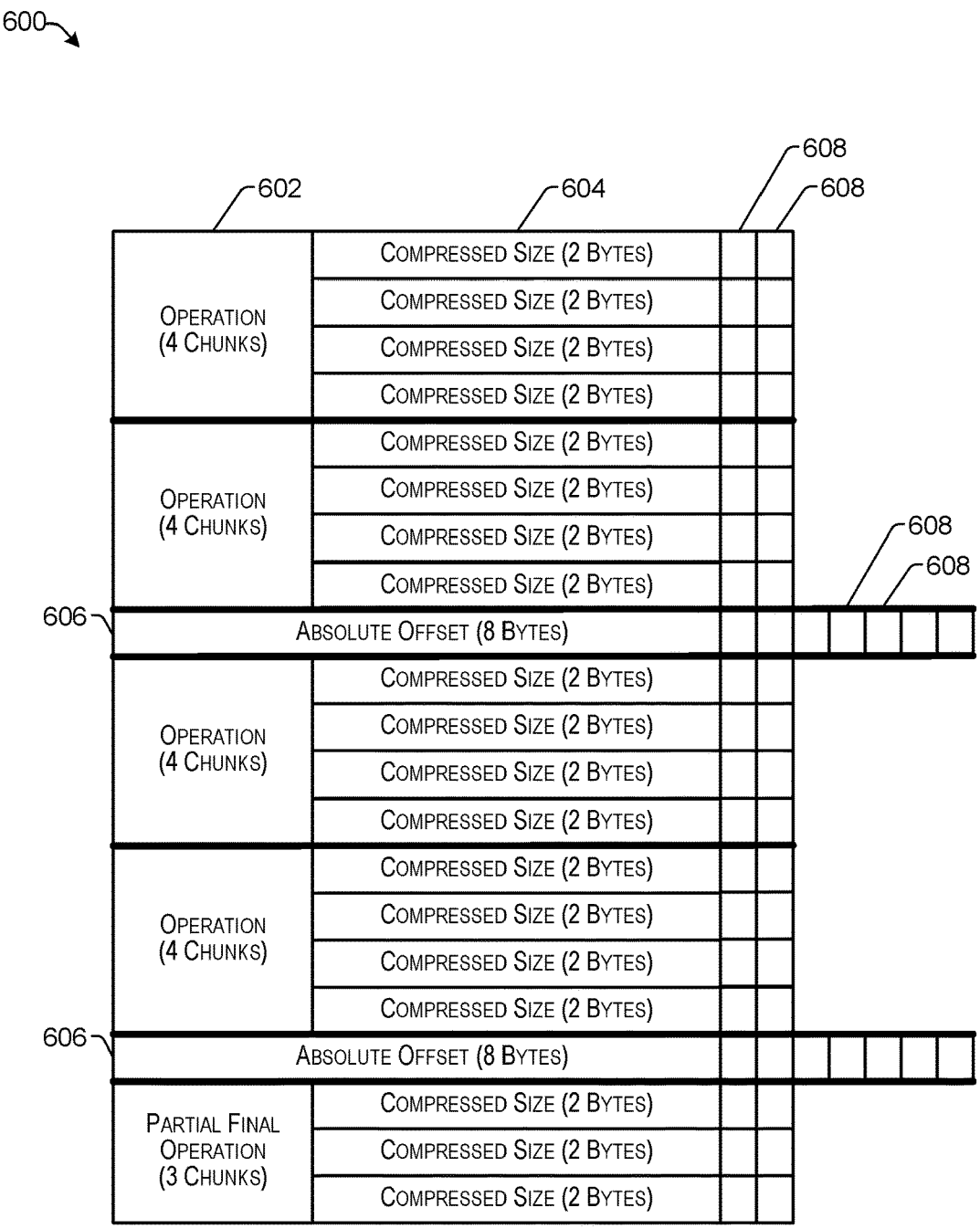
FIG. 6 illustrates an example data structure configuration of a map according to some implementations.

FIG. 6 illustrates an example data structure configuration of a map 600 according to some implementations. The map 600 includes an operation size indication 602 indicating a number of compressed chunk size representations per operation, and further includes a list of compressed chunk size representations 604 and periodic absolute offsets 606 into the compressed object. For example, the number of bytes used for the compressed chunk size representation is minimized based on chunk size, e.g., 2 bytes unless the chunk size is greater than 64K, in which case 3 bytes 608 may be used for the compressed chunk size representations 604. As mentioned above, the compressed size representation may be the actual compressed size of the corresponding chunk, may be "0" to signify compression was not used, or may be a special value to signify the individual chunk compressed size is not known while the sum of entries in the operation is the compressed operation size.

The absolute offsets 606 are the sum of all compressed and uncompressed chunk sizes since the last absolute offset 606. The absolute offsets 606 may be 8 bytes 608, and are not merely the sum of the entries for the preceding chunks. For example, when calculating the absolute offset, any 0s are replaced with the uncompressed chunk size of the corresponding chunk so the absolute offset 606 can be used to locate the chunk associated with the subsequent entry in the compressed object. If the maximum object size is less than 256 TB, two of the eight bytes used for the absolute offset 606 may be hard coded to signify an absolute offset.

Accordingly, in the map, compressed chunk sizes are represented in 2 bytes if uncompressed chunk size is <=64 k, or 3 bytes if chunk size is >64 k & <=16M, 4 bytes if Chunk Size is >16M. Furthermore, for each operation (group of chunks) if each chunk is compressed to less than the size of a chunk, then the size of compressed chunk is added to the map. If all chunks are uncompressed a zero may be use as the representation. Otherwise, a total of operation size may be equal to a compressed size of the operation but each individual chunk represented included in the operation does not necessarily indicate the compressed size of the corresponding chunk.

The map herein may be configured by a user on the like to best suit user needs. If the user needs fast access to very small ranges, the map can start with a small chunk size such as 1 KB. If an optimized map with 2 byte entries is the goal for undetermined workloads, an initial chunk size of 64 KB can be used. If memory availability is small or access speeds for very large objects is less important, a large operation size can be used such as 4 MB. If compression ratio is more important than time to read the map, a high offset frequency can be used such as 32768. Compaction guidelines can also be configured. The map memory footprint may be specified for when to attempt map compaction during ingest. It can also be specified if and how many times map compaction should be attempted after completion when a smaller resulting map can increase efficiency. Configuration options include chunk size, operation size, offset frequency, max map memory and a map size goal worth compacting for. The operation size may be power of 2 multiple of the chunk size. The offset frequency may be a multiple of the chunks per operation. Further, while an example data structure configuration of the map is illustrated in FIG. 6, numerous other possible data structure configurations for performing the same function will be apparent to those of skill in the art having the benefit of the disclosure herein.

FIG. 7 illustrates an example data structure configuration of a map 700 according to some implementations. In this example, the map 700 include a chunk size representation 702 for each chunk, respectively, and a description 704 for explanation purposes. For instance, chunk size representations for rows 706-712 are not compressed and, therefore, the value assigned for the chunk size representations is "0" for rows 706-712. Further, rows 714, 718, 720, 726, and 730 have special size entries, while rows 716, 724 and 728 include the size of the respective chunk plus some overflow from the special size. In addition, rows 732-738 and 742-746 have regular compressed data, while rows 722 and 740 serve as the absolute offset.

In this example, suppose that chunk Size=64K, the operation size=256K (4 chunks), and the absolute offset frequency=8. Thus, the map 700 includes five operations, a first operation 750 including chunk size representations 706-712; a second operation 752 including chunk size representations 714-716; a third operation 754 including chunk size representations 724-730; a fourth operation 756 including chunk size representations 732-738; and a fifth operation 758 including chunk size representations 742-746.

FIG. 8 illustrates the example data structure configuration of a map 800 after one compaction according to some implementations. In this example, after one compaction, the chunk Size=128K (3 byte size entries) and the absolute offset frequency remains=8. Further, the compaction has resulted in two chunk size representations per operation, each representing a combination of two chunk sizes from the map 700 of FIG. 7. For example the first operation 750 has been compacted from four chunk size representations to two chunk size representations 802 and 804; the second operation 752 has been compacted from four chunk size representations to two chunk size representations 806 and 808; the third operation 754 has been compacted from four chunk size representations to two chunk size representations 810 and 812; the fourth operation 756 has been compacted from four chunk size representations to two chunk size representations 814 and 816; and the fifth operation 758 has been compacted from three chunk size representations to two chunk size representations 820 and 746. The final chunk size representations 746 in this example was not combined with another chunk size representation during compaction due to there being an odd number of chunk size representations in the fifth operation 758, and thus, retains the same value as before compaction.

As a result of compaction, the chunk size representation values for 802 and 804 in the first operation 750 are both "0" based on combining "0" during compaction. The second operation 752 includes a size with overflow value at 806, and a special size at 808. The overall value of the operations 750, 752, 754, and 756 at the absolute offset 818 is 782330 in compacted map 800, which is the same as the value the absolute offset 740 in map 700 of FIG. 7.

FIGS. 9-12 are flow diagrams illustrating example processes according to some implementations. The processes are illustrated as collections of blocks in logical flow diagrams, which represent a sequence of operations, some or all of which may be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation. Any number of the described blocks can be combined in any order and/or in parallel to implement the process, or alternative processes, and not all of the blocks need be executed. For discussion purposes, the processes are described with reference to the environments, frameworks, and systems described in the examples herein, although the processes may be implemented in a wide variety of other environments, frameworks, and systems.

Figure 9:
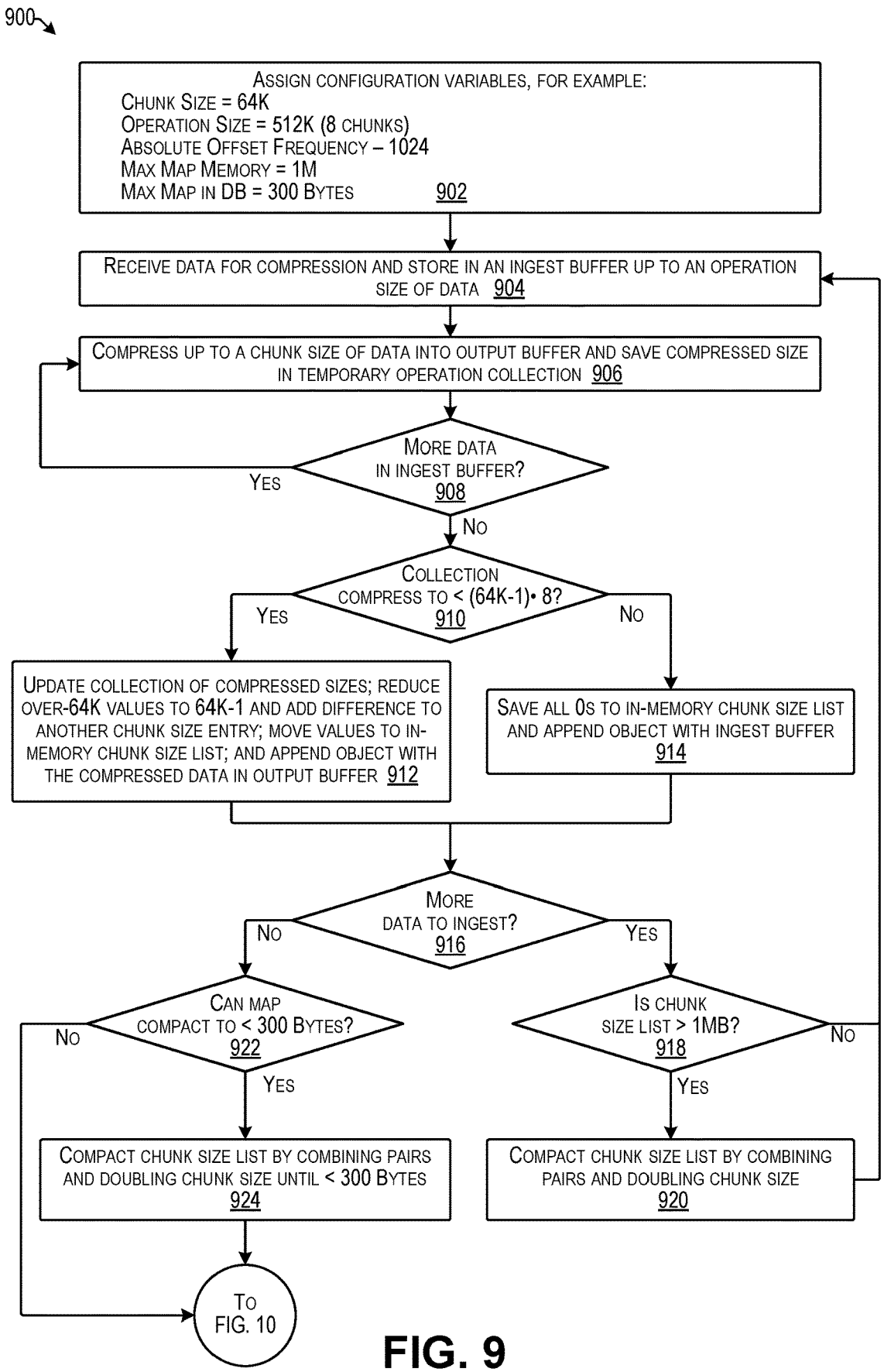
FIG. 9 is a flow diagram illustrating an example process for compression and map generation according to some implementations.

FIG. 9 is a flow diagram illustrating an example process 900 for compression and map generation according to some implementations. In some cases, the process 900 may be executed at least in part by the service computing device or other suitable computing device. As one example, the storage program executed by the one of more processors 110 of the service computing device(s) 102 discussed above with respect to FIG. 1 may include executable instructions for performing at least part of the process 900 of FIG. 9.

While data is compressed for each chunk, the results may be determined for the compression and the map may be created based on operations of multiple chunks. Each chunk in the operation is compressed and the results are stored in the map in memory. If compression on the operation is not useful, no compression is used and all compressed chunk sizes are labeled "0" in the map. Alternatively, if compression is useful for the operation overall (e.g., a threshold level of compression is achieved by compressing the operation), but compression of one or more chunks in the operation is not, the compressed size does not fit in the compressed chunk size field, then a special size is entered in the map entry for the one or more chunks, e.g., [64K–1] in the case of two-byte field chunk representations or [16M-256] in the case of a three-byte field chunk representations. Furthermore, the overflow size (e.g., when the amount compressed size is greater than the special size) may be distributed to a neighbor chunk representation with which the special size chunk representation may be compacted and that has sufficient room.

In other cases, if the operation compression is useful and the compressed chunk size fits in the map entries for the chunk size representations, the chunk size representation is labeled as the actual compressed size. The map may be compacted between collections or following completion of compression of the data in some cases. After all the operations are complete the map header is finalized and saved. In some cases, the map header may be appended to the map or may be retained separately. Further the map may be appended to the compressed object in some example, or may be stored separately in other examples. The uncompressed object size and the compressed object size are now known and may be recorded.

At 902, prior to beginning compression of a data object, the computing device may receive and/or assign configuration variables, for example: chunk size, operation size, absolute offset frequency, maximum map memory size, maximum map in database size. In some examples, default values for these parameters may have already been established by a user, such as an administrator or other user managing compression operations performed by the service computing devices. For purposes of this example, suppose that the Chunk Size=64K, the Operation Size=512K (8 chunks), the Absolute Offset Frequency is 1024 entries, the Max Map Memory=1M, and the Max Map in DB=300 Bytes. These values are just for discussion purposes, and implementations herein are not limited to any particular values for these parameters.

At 904, the computing device may receive data for compression and store at least a portion of the received data in an ingest buffer, e.g., up to an operation size of data. In some examples, the data may be received as streaming data over a network, while in other cases, the data may be read from a storage location, or the like.

At 906, the computing device may compress up to a chunk size of the received data into output buffer and may store the compressed size of the chunk in a temporary operation collection.

At 908, the computing device may determine if there is more data in the ingest buffer. For example, if an operation's worth of data is added to the ingest buffer (e.g., eight chunk sizes amount in this example, corresponding to the designated operation size (512K) mentioned at 902 above), the computing device may operate on individual chunks of the data in the ingest buffer until the ingest buffer is empty. When the ingest buffer is empty, an operation's worth of data has been processed, and the computing device may determine whether the threshold level of compression has been met for the operation. If there is still data in the ingest buffer, the process returns to 906. Otherwise, the process goes to 910.

At 910 the computing device may determine if the collection of chunks in the operation compress to less than chunk size minus one times number of chunks in the operation. For example, the specific value of the compression threshold in this example is (64K−1)·8. If the operation compresses to less than the threshold, the process goes to 912. If not, the process goes to 914.

At 912, when the compression threshold is met, the computing device may update collection of compressed sizes; reduce values over 64K to values equal to 64K−1 and may add the overflow (difference) to another chunk size representation entry as discussed above, e.g., with respect to FIGS. 3 and 4. Further, the computing device may move values to an in-memory chunk size list in the map and may append the compressed data in the output buffer to any already processed object data.

At 914, on the other hand, when the compression threshold is not met, the computing device may save all 0s to the in-memory chunk size list in the map and may append the ingest buffer data to any already processed object data.

At 916, the computing device may determine whether there is more data to ingest into the ingest buffer. If so, the process goes to 918. If not, the process goes to 922.

At 918, when there is more data to ingest into the ingest buffer, the computing device may determine whether it is desirable to compact the existing map by determining whether the chunk size list is greater than 1 MB. For example, at 902 above, the maximum map memory was designated to 1 MB. Accordingly, at this point, if the map size exceeds this amount, the map may be compacted. If not, the process returns to 904 to add more data to the ingest buffer.

At 920, if the map size exceeds a specified threshold amount (e.g., 1 MB in this example) the computing device may compact chunk size list in the map by combining neighbor pairs and doubling chunk size. If this operation is possible (e.g., chunk size is still less than operation size), then one compaction is expected to be sufficient to reduce the map size to less than the 1 MB specified in the configuration information. Following compaction of the map, the process returns to 904 to add more data to the ingest buffer.

At 922, when there is no more data to add to the ingest buffer, this indicates that compression of the data object is complete, and the computing device may determine if the map can be compacted to the maximum DB size. If so, the process goes to 924. If not, the process goes to the process of FIG. 10.

At 924, the computing device may compact the chunk size list in the map by combining neighbor pairs and doubling chunk size until the map size is less than the maximum map DB size, e.g., less than 300 Bytes in this example. Following compaction of the map, the process goes to the process of FIG. 10.

Figure 10:
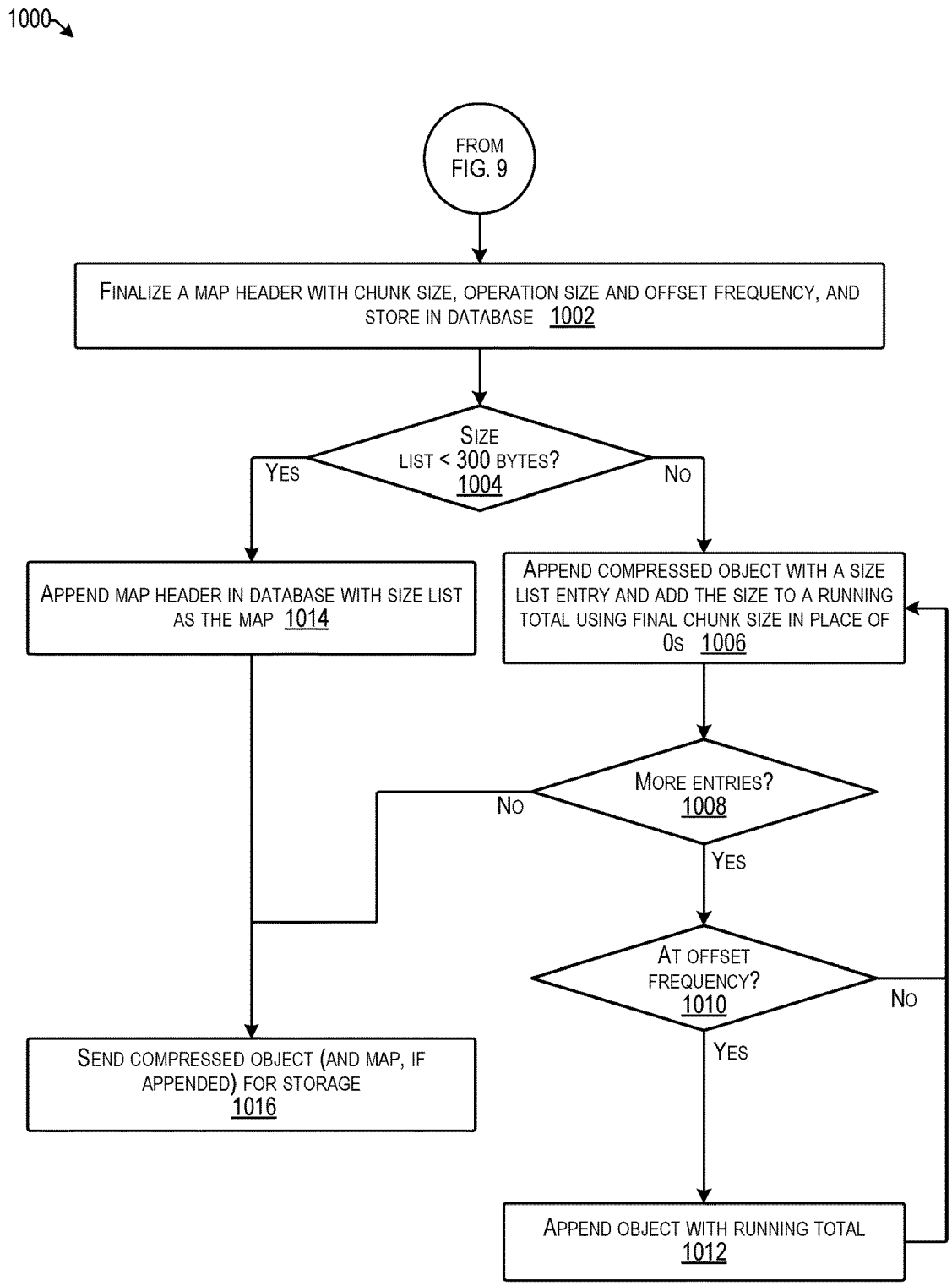
FIG. 10 is a flow diagram illustrating an example process that is a continuation of the process of FIG. 9 according to some implementations.

FIG. 10 is a flow diagram illustrating an example process 1000 that is a continuation of the process 900 of FIG. 9 according to some implementations.

At 1002, the computing device may finalize a map header for the map with chunk size, operation size, offset frequency, and other parameters discussed above with respect to FIG. 5, and may store at least the map header in a database, such as the metadata database 120 discussed above with respect to FIG. 1. In some cases, the map may also be stored in the database and/or may be appended to the object for storage at the network storage.

At 1004, the computing device may determine if the map size list is less than 300 Bytes, e.g., the maximum DB size. If not, the process goes to 1006. If so, the process goes to 1014.

At 1006, the computing device may append the compressed object with a size list entry and add the size to a running total using final chunk size in place of 0s so that the total size in the absolute offsets is accurate.

At 1008, the computing device may determine if there are more entries in the map. If so the process goes to 1010. If not, the process goes to 1016.

At 1010, the computing device may determine if the additional entries are at an offset frequency. If so, the process goes to 1012. If not, the process goes to 1006.

At 1012 the computing device may append the compressed object the running total for the size list entries and return to 1006.

At 1014, when the map size list is less than the database maximum threshold, e.g., less than 300 Bytes in this example, the computing device may append the map header in the metadata database with the size list as the map.

At 1016, the computing device may send the compressed object (and the map if appended to the compressed object) to a storage location for storage. For instance, as discussed above with respect to FIG. 1, in some examples, the compressed object and map may be stored at a network storage location.

Figure 11:
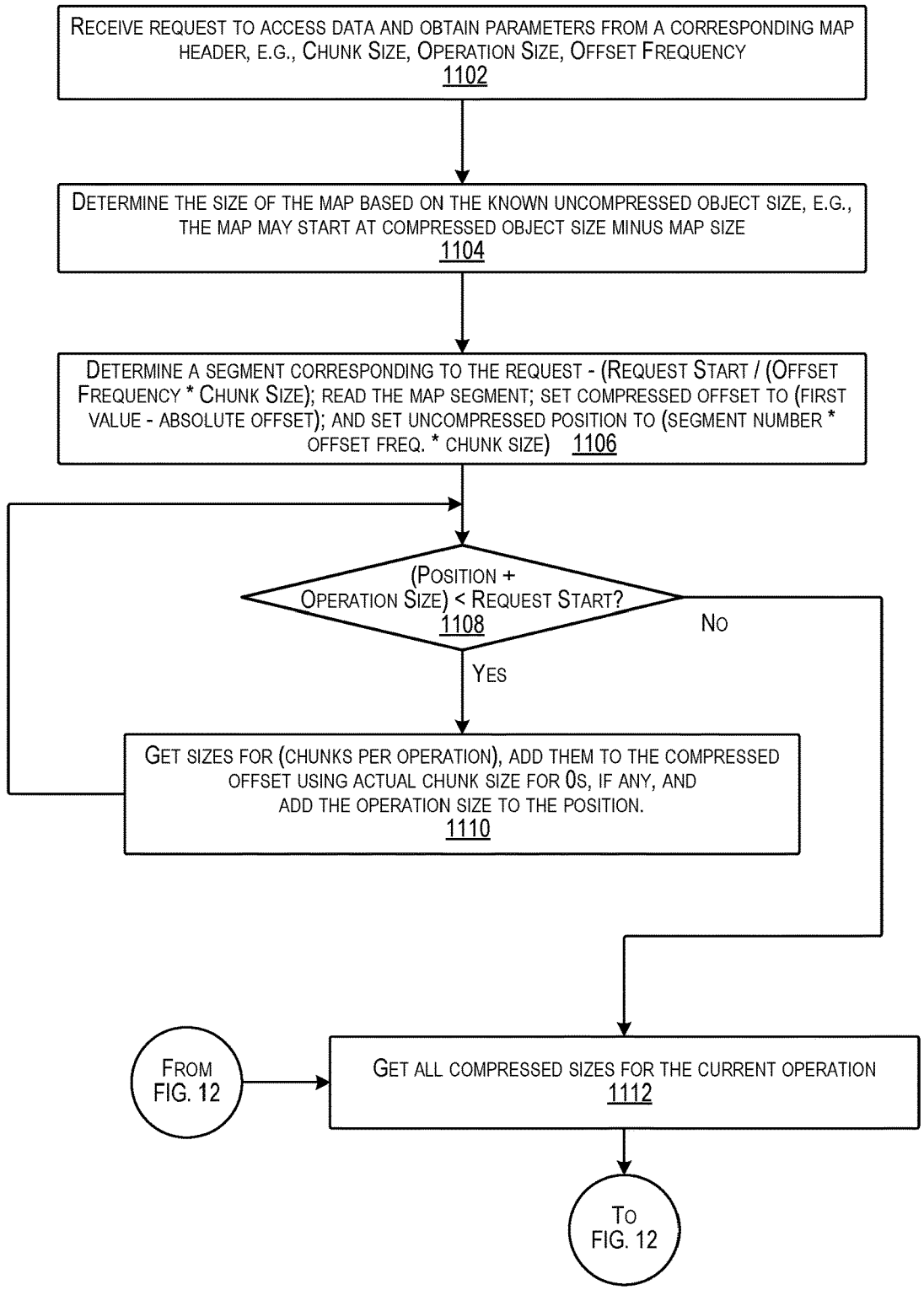
FIG. 11 is a flow diagram illustrating an example process for decompression based on a map according to some implementations.

FIG. 11 is a flow diagram illustrating an example process 1100 for decompression based on a map according to some implementations. In some cases, the process 1100 may be executed at least in part by the service computing device or other suitable computing device. As one example, the storage program executed by the one of more processors of the service computing device(s) 102 discussed above with respect to FIG. 1 may include executable instructions for performing at least part of the process 1100 of FIG. 11.

When a request to access at least a portion of a compressed data object is received, the service computing device may access and read the map header for the object to determine parameters including chunk size, operation size, offset frequency, map state and special value indicator, e.g., as discussed above with respect to FIG. 5. If there is no map or all chunks are compressed and the request starts with position 0, the computing device may decompress all data of the object without the map. For example, the object may not have been large enough for generating a map or the like.

In some examples, the map may be found following the header if the map was stored in the metadata database with the header, or in other examples, the map be appended to the end of the compressed object or stored at a separate storage location. The map size may be calculated as the number of chunks (uncompressed object size divided by chunk size) times the number of bytes in a compressed chunk size representation entry plus the number of absolute offsets (number of chunks divided by offset frequency) times the number of chunks in an operation (e.g., 8 in the example of FIGS. 9 and 10). In the case that the map was appended to the compressed object, the map may be found at map size bytes before the end of the compressed object.

The computing device may determine the map segment where the request starts based on, e.g., (Request Start/(Offset Frequency*Chunk Size)). The computing device may read map segments from the calculated first segment through the final segment for the request size. The computing device may skip to the last operation that does not come after the request start. If any chunks in the operation can and do have a special size (multiple of 64K−1), the computing device may decompress starting with the first chunk in the operation discarding data before the requested start position. If no chunk in the operation has a 0 or special size, the computing device may skip chunks until the next chunk position is higher, start decompression, and discard data before the requested start position. If the compressed size entries are 0, the computing device may copy data from the compressed object starting at the position within the operation requested up to through the rest of the operation. The computing device may continue decompressing subsequently needed operations or copying data if any compressed size entries are 0 until the requested size is satisfied.

At 1102, the computing device may receive a request to access data and may obtain parameters from a corresponding map header, e.g., chunk size, operation size, and offset frequency. For example, a user, an application, or the like, may request to access one or more portions of one or more stored compressed objects. For example, a read request may be for a range of data from the compressed object. The starting position and size may be specified in the request based, e.g., on a starting position and size in the uncompressed object.

At 1104, the computing device may determine the size of the map based on the known uncompressed object size, e.g., the map may start at compressed object size minus map size. For example, the compressed object size and the uncompressed object size may have been stored in the metadata database during ingestion and compression of the object.

At 1106, the computing device may determine a segment corresponding to the request, e.g., based on (Request Start/(Offset Frequency*Chunk Size)). Further, the computing device may read the map segment, set the compressed offset to (first value−absolute offset), and set the uncompressed position to (Segment Number*Offset Frequency*Chunk Size). For instance, a map segment may be a collection of map entries that can be used without the rest of the map because the map segment starts with an Absolute Offset to establish bearings in the compressed object.

At 1108, the computing device may determine if the (Position+Operation Size) is less than the Request Start. If so, the process goes to 1110. If not, the process goes to 1112. For example, the position may be the starting position, such as based on the position determined from the uncompressed object.

At 1110, the computing device may get sizes for (chunks per operation), add them to the compressed offset using actual chunk size for 0s, if any, and add the operation size to the position. The process returns to 1108 to determine whether (Position+Operation Size) is less than the Request Start. The operation at 1108 and 1110 is repeated until the process goes to 1112.

Figure 12:
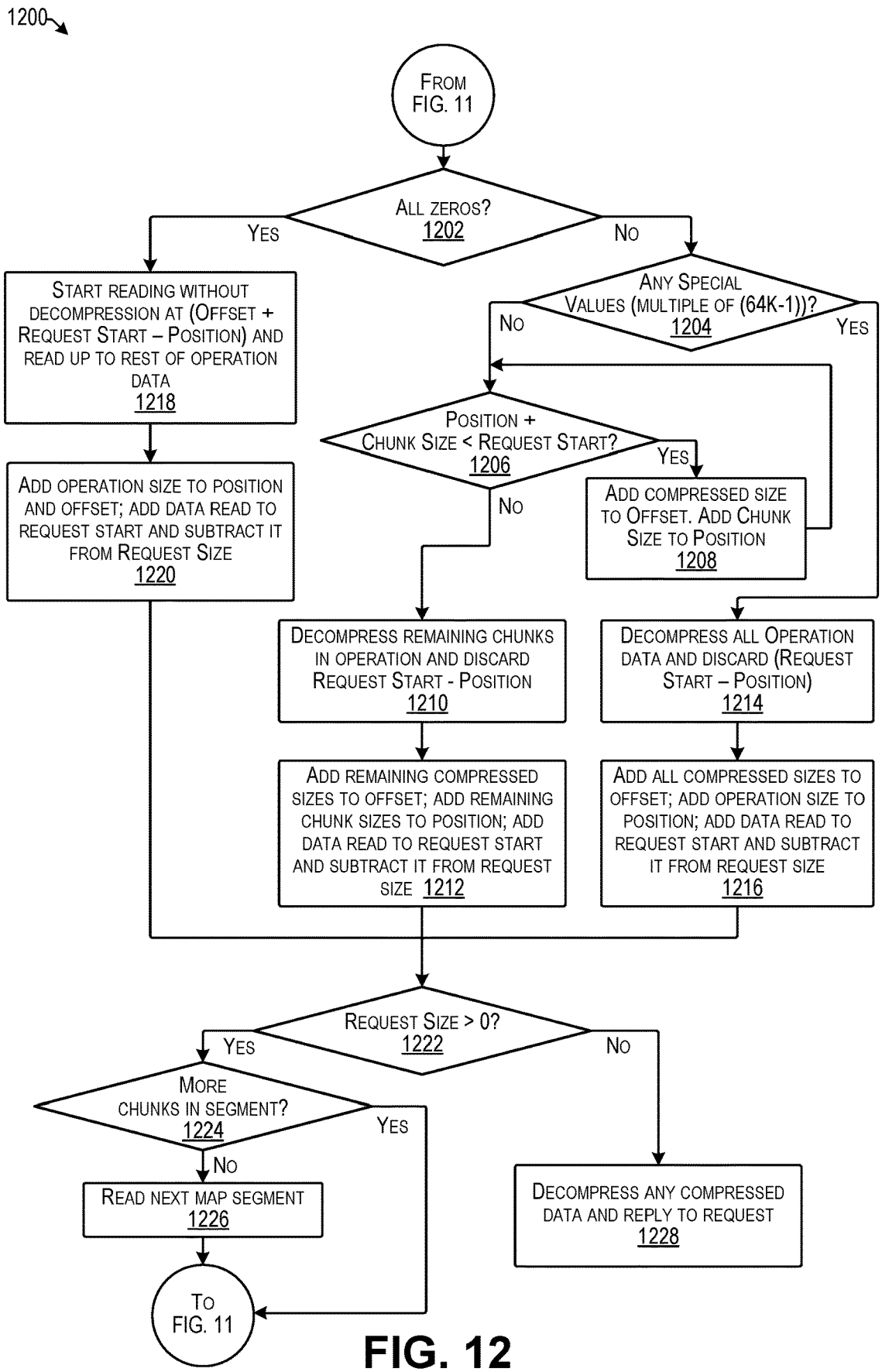
FIG. 12 is a flow diagram illustrating an example process that is a continuation of the process of FIG. 11 according to some implementations.

At 1112, the computing device may get all compressed sizes for the current operation and may proceed to the process of FIG. 12.

FIG. 12 is a flow diagram illustrating an example process 1200 that is a continuation of the process 1100 of FIG. 11 according to some implementations.

At 1202, the computing device may determine if the compressed sizes are all zeros. If so, the process goes to 1218. If not, the process goes to 1204.

At 1204, the computing device may determine if there are any special values (multiples of (64K−1)). If so, the process goes to 1214. If not, the process goes to 1206.

At 1206, the computing device may determine whether (Position+Chunk Size)<Request Start. If so, the process goes to 1208. If not, the process goes to 1210.

At 1208, the computing device may add the compressed size to the offset and may add the Chunk Size to the Position.

At 1210, the computing device may the computing device may decompress remaining chunks in the operation and discard (Request Start−Position).

At 1212, the computing device may add the remaining compressed sizes to the offset, add the remaining chunk sizes to the Position, and add the data read to the Request Start and subtract the data read from the Request Size.

At 1214, in the case that there is a special value found at 1204, the computing device may decompress all Operation data and discard (Request Start−Position)

At 1216, the computing device may add all compressed sizes to the offset, add Operation Size to Position, add data read to Request Start and subtract the data read from Request Size.

At 1218, if the compressed sizes for an operation are all zeros at 1202, the computing device may start reading data without decompression at (Offset+Request Start−Position) and may read up to the rest of the operation data.

At 1220, the computing device may add the operation size to position and offset, add the data read to the Request Start and subtract the data read from the Request Size At 1222, the computing device may determine whether the Request Size is greater than zero. If so, the process goes to 1224. If not, the process goes to 1228.

At 1224, the computing device may determine whether there are more chunk representations in the segment. If so, the process goes to the process of FIG. 11 to block 1112. If not, the process goes to 1226.

At 1226, the computing device may read the next map segment and go to block 1112 in FIG. 11.

At 1228, when the Request Size has reached zero, the computing device may decompress any compressed data that has not already been decompressed and may reply to the request.

The example processes described herein are only examples of processes provided for discussion purposes. Numerous other variations will be apparent to those of skill in the art in light of the disclosure herein. Further, while the disclosure herein sets forth several examples of suitable frameworks, architectures and environments for executing the processes, the implementations herein are not limited to the particular examples shown and discussed. Furthermore, this disclosure provides various example implementations, as described and as illustrated in the drawings. However, this disclosure is not limited to the implementations described and illustrated herein, but can extend to other implementations, as would be known or as would become known to those skilled in the art.

Various instructions, processes, and techniques described herein may be considered in the general context of computer-executable instructions, such as programs stored on computer-readable media, and executed by the processor(s) herein. Generally, programs include applications, routines, objects, components, data structures, executable code, etc., for performing particular tasks or implementing particular abstract data types. These programs, and the like, may be executed as native code or may be downloaded and executed, such as in a virtual machine or other just-in-time compilation execution environment. Typically, the functionality of the programs may be combined or distributed as desired in various implementations. An implementation of these modules and techniques may be stored on computer-readable storage media or transmitted across some form of communication media.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A system comprising:
one or more processors; and
one or more non-transitory computer-readable media storing executable instructions, which, when executed by the one or more processors, configure the one or more processors to perform operations comprising:
receiving a plurality of chunks of data of a data object;
compressing the plurality of chunks of data to obtain a plurality of compressed chunks;
determining whether the plurality of compressed chunks together are less than a first threshold size;
based on determining the plurality of compressed chunks together are less than the first threshold size, adding, to respective entries in a map data structure, chunk size representations corresponding to respective chunks of the plurality of compressed chunks, the chunk size representations in the map data structure indicating compressed sizes of respective compressed chunks of at least the plurality of compressed chunks of the data object, wherein the map data structure includes at least one offset indicator as a reference point that locates, in a compressed object, a compressed chunk associated with a subsequent entry in the map data structure that is subsequent to the at least one offset indicator, wherein a respective offset indicator of the at least one offset indicator corresponds to a respective position in the compressed object;
compacting the map data structure to create a compacted map data structure by determining a plurality of pairs of adjacent entries in the map data structure, and, for each pair of adjacent entries of the plurality of pairs of adjacent entries in the map data structure, combining the chunk size representations of the adjacent entries in the pair of adjacent entries to create, in the compacted map data structure, a single entry including a combined chunk size representation determined by combining the chunk size representations of the adjacent entries of the pair of adjacent entries in the map data structure; and
storing the plurality of compressed chunks and the compacted map data structure.

2. The system as recited in claim 1, wherein the plurality of chunks is a first plurality of chunks of the data object, and the plurality of compressed chunks is a first plurality of compressed chunks, the operations further comprising:
receiving a second plurality of chunks of data of the data object;
compressing the second plurality of chunks of data to obtain a second plurality of compressed chunks;
determining whether the second plurality of compressed chunks together are less than the first threshold size;
based on determining the second plurality of compressed chunks together are not less than the first threshold size, adding, to respective entries in the map data structure, a value indicating that the second plurality of chunks are not compressed; and
storing the second plurality of chunks in non-compressed form with the first plurality of compressed chunks.

3. The system as recited in claim 1, wherein at least one of the chunks of the plurality of chunks of data included with the plurality of compressed chunks is not compressible, the plurality of compressed chunks being overall compressible, the operations further comprising:
including a predetermined value for the at least one of the chunks in the respective entry in the map data structure, the predetermined value having a size indicating that the at least one of the chunks is not compressed; and
distributing an overflow value corresponding to a difference between the predetermined value and an actual size value for the at least one of the chunks to at least one other entry in the map data structure corresponding to at least one of the compressed chunks of the plurality of compressed chunks.

4. The system as recited in claim 3, the operations further comprising:
determining whether each of the compressed chunks individually is less than a second threshold size;
based on determining that the actual size value of the at least one of the chunks of the plurality of chunks exceeds the second threshold size following attempted compression, determining that the at least one of the chunks is not compressible;
entering the predetermined value as the chunk size representation in the respective entry for the at least one of the chunks in the map data structure; and
distributing the overflow value by adding the difference between the actual size value and the predetermined value to the compressed size of the at least one of the compressed chunks, the at least one of the compressed chunks having a compressed size less than the second threshold size.

5. The system as recited in claim 3, wherein during compaction of the map data structure, the predetermined value is combined with a chunk size representation of a respective adjacent entry in the map data structure.

6. The system as recited in claim 1, the operations further comprising generating a header for at least one of the map data structure or the compacted map data structure, the header including an indication of a chunk size and an indication of a storage location of the compacted map data structure.

7. The system as recited in claim 6, wherein storing the compacted map data structure comprises at least one of:
storing the compacted map data structure in a metadata database in association with the header; or
storing the compacted map at a network storage location in association with the compressed object following compression of at least a portion of the data object.

8. The system as recited in claim 1, the operations further comprising:
- receiving a request to access data in the data object following at least partial compression of the data object;
- determining a range of data to be retrieved from the data object;
- based on the range, using the compacted map data structure to read part of the compressed object following the at least partial compression of the data object;
- decompressing compressed data in the part of the compressed object to obtain the range of data; and
- returning the range of data in response to the request.

9. The system as recited in claim 8, wherein using the compacted map data structure to read part of the data object comprises:
- determining a position in the data object in non-compressed form corresponding to the request;
- correlating the position to an offset indictor of the at least one offset indicator in the map data structure as a start location in the compressed object following at least partial compression of the data object; and
- reading data based on the start location and the entries in the compacted map data structure.

10. The system as recited in claim 8, wherein using the compacted map data structure to read part of the compressed object comprises:
- determining a position in the data object in non-compressed form corresponding to the request;
- correlating the position in the data object to a position in the compacted map data structure based on a compressed size of at least one chunk indicated in at least one entry in the compacted map data structure to determine a start location in the compressed object; and
- reading data of the data object based at least on the start location.

11. The system as recited in claim 1, the operations further comprising compacting the map data structure multiple times until a size of the compacted map data structure is less than a threshold map size.

12. The system as recited in claim 1, wherein the at least one offset indicator indicates a total size of compressed chunks and non-compressed chunks corresponding to entries preceding the at least one offset indicator in the map data structure.

13. One or more non-transitory computer-readable media storing instructions that, when executed by one or more processors, program the one or more processors to perform operations comprising:
- receiving a plurality of chunks of data of a data object;
- compressing the plurality of chunks of data to obtain a plurality of compressed chunks;
- determining whether the plurality of compressed chunks together are less than a threshold size;
- based on determining the plurality of compressed chunks together are less than the threshold size, adding, to respective entries in a map data structure, chunk size representations corresponding to respective chunks of the plurality of compressed chunks, the chunk size representations in the map data structure indicating compressed sizes of respective compressed chunks of at least the plurality of compressed chunks of the data object, wherein the map data structure includes at least one offset indicator as a reference point that locates, in a compressed object, a compressed chunk associated with a subsequent entry in the map data structure that is subsequent to the at least one offset indicator, wherein a respective offset indicator of the at least one offset indicator corresponds to a respective position in the compressed object;
- compacting the map data structure to create a compacted map data structure by determining a plurality of pairs of adjacent entries in the map data structure, and, for each pair of adjacent entries of the plurality of pairs of adjacent entries in the map data structure, combining the chunk size representations of the adjacent entries in the pair of adjacent entries to create, in the compacted map data structure, a single entry including a combined chunk size representation determined by combining the chunk size representations of the adjacent entries of the pair of adjacent entries in the map data structure; and
- storing the plurality of compressed chunks and the compacted map data structure.

14. A method comprising:
- receiving, by one or more processors, a plurality of chunks of data of a data object;
- compressing the plurality of chunks of data to obtain a plurality of compressed chunks;
- determining whether the plurality of compressed chunks together are less than a threshold size;
- based on determining the plurality of compressed chunks together are less than the threshold size, adding, to respective entries in a map data structure, chunk size representations corresponding to respective chunks of the plurality of compressed chunks, the chunk size representations in the map data structure indicating compressed sizes of respective compressed chunks of at least the plurality of compressed chunks of the data object, wherein the map data structure includes at least one offset indicator as a reference point that locates, in a compressed object, a compressed chunk associated with a subsequent entry in the map data structure that is subsequent to the at least one offset indicator, wherein a respective offset indicator of the at least one offset indicator corresponds to a respective position in the compressed object;
- compacting the map data structure to create a compacted map data structure by determining a plurality of pairs of adjacent entries in the map data structure, and, for each pair of adjacent entries of the plurality of pairs of adjacent entries in the map data structure, combining the chunk size representations of the adjacent entries in the pair of adjacent entries to create, in the compacted map data structure, for each pair of adjacent entries of the plurality of pairs of adjacent entries, a single entry including a combined chunk size representation determined by combining the chunk size representations of the adjacent entries of the pair of adjacent entries in the map data structure; and
- storing the plurality of compressed chunks and the compacted map data structure.

15. The method as recited in claim 14,
- wherein the at least one offset indicator indicates a total size of compressed chunks and non-compressed chunks corresponding to entries preceding the at least one offset indicator in the map data structure.

16. The method as recited in claim 14, further comprising generating a header for at least one of the map data structure or the compacted map data structure, the header including an indication of a chunk size and an indication of a storage location of the compacted map data structure.

17. The method as recited in claim 14, further comprising compacting the map data structure multiple times until a size of the compacted map data structure is less than a threshold map size.

18. The one or more non-transitory computer-readable media as recited in claim 13, the operations further comprising generating a header for at least one of the map data structure or the compacted map data structure, the header including an indication of a chunk size and an indication of a storage location of the compacted map data structure.

19. The one or more non-transitory computer-readable media as recited in claim 13, the operations further comprising compacting the map data structure multiple times until a size of the compacted map data structure is less than a threshold map size.

20. The one or more non-transitory computer-readable media as recited in claim 13, wherein the at least one offset indicator indicates a total size of compressed chunks and non-compressed chunks corresponding to entries preceding the offset indicator in the map data structure.

\* \* \* \* \*